US010818836B2

(12) United States Patent
Clochard et al.

(10) Patent No.: US 10,818,836 B2
(45) Date of Patent: Oct. 27, 2020

(54) PROCESS FOR FABRICATING A PIEZOELECTRIC NANOGENERATOR, PIEZOELECTRIC NANOGENERATOR OBTAINED BY THIS PROCESS AND DEVICE INCLUDING SUCH A PIEZOELECTRIC NANOGENERATOR

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); ECOLE POLYTECHNIQUE, Palaiseau (FR)

(72) Inventors: Marie-Claude Clochard, Sartrouville (FR); Melilli Giuseppe, Modica (IT); Jean-Eric Wegrowe, Verrieres-le-Buisson (FR); Travis Wade, Paris (FR); Emmanuel Balanzat, Anisy (FR); Eric Giglio, Caen (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); ECOLE POLYTECHNIQUE, Palaiseau (FR)

( * ) Notice: Subject to any disclaimer, the term of this patent is extended or adjusted under 35 U.S.C. 154(b) by 452 days.

(21) Appl. No.: 15/573,902

(22) PCT Filed: May 18, 2016

(86) PCT No.: PCT/IB2016/052897
§ 371 (c)(1),
(2) Date: Nov. 14, 2017

(87) PCT Pub. No.: WO2016/185399
PCT Pub. Date: Nov. 24, 2016

(65) Prior Publication Data
US 2018/0351076 A1    Dec. 6, 2018

(30) Foreign Application Priority Data

May 18, 2015   (FR) ...................................... 15 54412

(51) Int. Cl.
*H01L 41/332*   (2013.01)
*H01L 41/193*   (2006.01)
(Continued)

(52) U.S. Cl.
CPC ............ *H01L 41/332* (2013.01); *C25D 5/022* (2013.01); *H01G 4/005* (2013.01); *H01L 27/20* (2013.01);
(Continued)

(58) Field of Classification Search
None
See application file for complete search history.

(56) References Cited

U.S. PATENT DOCUMENTS

2008/0171251 A1   7/2008  Takagi et al.
2011/0163636 A1*  7/2011  Sirbuly .................. B82Y 30/00
                                                310/339

FOREIGN PATENT DOCUMENTS

WO    2012/153050    11/2012

OTHER PUBLICATIONS

Seungnam Cha et al., "Porous PVDF as Effective Sonic Wave Driven Nanogenerators", Nano Letters, vol. 11, No. 12, Dec. 14, 2011, pp. 5142-5147.
(Continued)

*Primary Examiner* — Louis J Rufo
(74) *Attorney, Agent, or Firm* — Lex IP Meister, PLLC

(57) ABSTRACT

The invention relates to a process for fabricating a piezoelectric nanogenerator, to a piezoelectric nanogenerator obtained by this process and to a device including such a
(Continued)

piezoelectric nanogenerator connected to a capacitor, said process comprising the following steps: a) providing a membrane (100) made of polarised β-PVDF or polarised P(VDF-TrFe) copolymer and therefore having piezoelectric properties, said membrane (100) moreover having two external major faces (11, 12) that are separated by a membrane thickness (e); b) irradiating the entirety of the thickness of said membrane (100), via at least one of its two external major faces (11, 12), with heavy ions having a fluence of between $10^3$ ions/cm2 and $10^{10}$ ions/cm2, as a result of which a membrane (101) containing latent traces (TL) of the passage of the heavy ions through the entirety of its thickness is obtained; c) revealing the latent traces (TL) using a chemical process of length that is preset so as to preserve a defect zone (ZD) belonging to the latent trace, as a result of which a nanostructured membrane is obtained having nanopores including, around each nanopore, a defect zone (ZD); d) depositing a layer of an electrical conductor on one (12) of the two external major faces (11, 12) of said membrane; e) electrodepositing an electrical conductor or semiconductor in the nanopores, the electrodeposition being stopped before the nanopores have been completely filled, as a result of which a nanostructured membrane is obtained having nanowires (15) partially filling the nanopores; and f) depositing a layer, of an electrical conductor, on the other (11) of the two external major faces (11, 12) and which therefore does not make contact with the nanowires.

9 Claims, 7 Drawing Sheets

(51) Int. Cl.
| | | |
|---|---|---|
| *H01L 41/29* | (2013.01) | |
| *H01L 41/047* | (2006.01) | |
| *H01L 41/113* | (2006.01) | |
| *C25D 5/02* | (2006.01) | |
| *H01G 4/005* | (2006.01) | |
| *H01L 27/20* | (2006.01) | |
| *H01L 41/04* | (2006.01) | |
| *H02N 2/18* | (2006.01) | |
| *H02N 2/00* | (2006.01) | |
| *H01L 27/142* | (2014.01) | |
| *H01L 27/16* | (2006.01) | |

(52) U.S. Cl.
CPC ............ *H01L 41/04* (2013.01); *H01L 41/047* (2013.01); *H01L 41/113* (2013.01); *H01L 41/1138* (2013.01); *H01L 41/193* (2013.01); *H01L 41/29* (2013.01); *H02N 2/181* (2013.01); *H02N 2/22* (2013.01); *H01L 27/142* (2013.01); *H01L 27/16* (2013.01)

(56) References Cited

OTHER PUBLICATIONS

M. Grasselli, et al., "Making porous membranes by chemical etching of heavy-ion tracks in beta-PVDF films", Nuclear Instruments and Methods in Physics Research, Section B: Beam Interactions With Materials and Atoms, Elsevier B.V., vol. 236, No. 1-4, Jul. 1, 2005, pp. 501-507.

A. Fert et al., "Magnetic nanowires", Journal of Magnetism and Magnetic Materials, Elsevier Science Publishers, vol. 200, No. 1-3, Oct. 1, 1999, pp. 338-358

T. Yamaki et al., "Ion-track membranes of fluoropolymers: Toward controlling the pore size and shape", Nuclear Instruments and Methods in Physics Research B: Beam Interactions With Materials and Atoms, Elsevier B.V., vol. 314, Nov. 1, 2013, pp. 77-81.

\* cited by examiner

PROCESS FOR FABRICATING A PIEZOELECTRIC NANOGENERATOR, PIEZOELECTRIC NANOGENERATOR OBTAINED BY THIS PROCESS AND DEVICE INCLUDING SUCH A PIEZOELECTRIC NANOGENERATOR

The invention relates to a process for fabricating a piezoelectric nanogenerator.

It also relates to a piezoelectric generator obtained with this fabrication process and to a device comprising said piezoelectric nanogenerator.

One process for fabricating a piezoelectric nanogenerator is proposed in the article by Cha et al. «*Nanoporous PVDF as effective sonic wave driven nanogenerators*», in Nano Letters (2011), 11, 5142-5147.

The main steps of the fabrication process proposed in this article are the following:
- anodising a membrane in alumina to create nanopores;
- depositing a metal layer (gold-plating for electric contact);
- electroplating a metal in the nanopores;
- casting a polymer, in the molten state into the nanopores;
- dissolving the alumina;
- applying strong pressure to change the alpha phase (non-organised) to beta phase (potentially piezoelectric);
- applying a strong electric field to polarise the beta phase PVDF, thereby making it piezoelectric;
- depositing another metal layer (gold-plating for the other electrical contact).

This fabrication process is difficult to implement, in particular to manage pore density.

In addition, the piezoelectric properties of the piezoelectric nanogenerator thus fabricated are limited by the piezoelectric properties of the polarised beta phase PVDF.

It is therefore one objective of the invention to propose a fabrication process that is easier to implement and allows increased piezoelectric properties to be obtained.

To reach this objective there is proposed a process for fabricating a piezoelectric nanogenerator, comprising the following steps:
a) providing a membrane in polarised β-PVDF or polarised PVDF-ETrF copolymer therefore having piezoelectric properties, said membrane also having two main outer surfaces separated by a membrane thickness e;
b) irradiating said membrane, via at least one of its two main outer surfaces through the entire thickness of said membrane, with heavy ions having fluence of between $10^3$ ions/cm$^2$ and $10^{10}$ ions/cm$^2$, after which a membrane is obtained having latent tracks left by the passing of the heavy ions through the entire thickness thereof;
c) chemically developing the latent tracks over a predetermined time to maintain a damage zone belonging to the latent track, after which a membrane nanostructured with nanopores is obtained comprising a damage zone around each nanopore;
d) depositing a layer of electrically conductive material on one of the two main outer surfaces of said membrane;
e) electroplating an electrically semi-conductive or conductive material in the nanopores, stopping electroplating before complete filling of the nanopores, after which a nanostructured membrane is obtained having nanowires partly filling the nanopores; and,
f) depositing a layer of electrically conductive material on the other of the two main outer surfaces, which is therefore not in contact with the nanowires.

The fabrication process conforming to the invention may also implement the following steps, taken alone or in combination:
- for irradiation of said membrane at step b), through the entire thickness thereof, the energy of the heavy ions is between 2 MeV/mau and 15 MeV/mau;
- irradiation step b) is performed with heavy ions of Kr or Xe type;
- irradiation step b) is performed with heavy ions having fluence of between $10^3$ ions/cm$^2$ and $10^9$ ions/cm$^2$, e.g. between $10^6$ ions/cm$^2$ and $10^9$ ions/cm$^2$;
- irradiation step b) is conducted in an inert atmosphere e.g. in helium;
- the chemical development step c) is performed via base hydrolysis with an aqueous solution of 10 KOH and 0.25 N KMnO$_4$, at a temperature of between 40° C. and 75° C., e.g. between 40° C. and 70° C., and preferably at 65° C.;
- said fabrication process additionally comprises the following steps A) to F):
A) implementing steps a) to e), where step b) is performed with fluence of between $10^3$ ions/cm$^2$ and $5.10^9$ ions/cm$^2$, preferably between $10^3$ ions/cm$^2$ and $10^8$ ions/cm$^2$, and the electroplating step e) forming nanowires with a first electrically semi-conductive or conductive material;
B) repeating steps b) and c), thereby allowing other nanopores to be formed, step b) being performed with fluence of between $10^3$ ions/cm$^2$ and $5.10^9$ ions/cm$^2$, preferably between $10^3$ ions/cm$^2$ and $10^8$ ions/cm$^2$;
C) removing the layer in electrically conductive material deposited at step d);
D) implementing step f), so that a layer in electrically conductive material is defined that is not in contact with the nanowires 15, on one main outer surface of said membrane;
E) repeating electroplating step e) to form other nanowires in said other nanopores with a second electrically semi-conductive or conductive material differing from the first electrically semi-conductive or conductive material; and
F) repeating step d).

said process additionally comprises following steps A') to H'):
A') implementing steps a) to d), step a) being performed with a first membrane called source membrane;
B') implementing steps a) to c), step a) being performed with another membrane called object membrane;
C') arranging the object membrane obtained after step B') on the source membrane obtained after step A');
D') implementing step e), this electroplating step allowing the partial filling of each of the nanopores formed by the association of at least one nanopore of the object membrane obtained after step B'), said nanopore being superimposed over at least one nanopore of the source membrane obtained after step A'), to form nanowires formed of a first electrically semi-conductive or conductive material, the other nanopores not being filled;
E') separating the two membranes from one another;
F') implementing step f) on the object membrane obtained after step E'), with the result that an electrically conductive layer is defined that is not in contact with the nanowires, on one of the main outer surfaces of said membrane;
G') implementing electroplating step e) on the object membrane obtained after step F') to form nanowires in said other nanopores with a second electrically semi-conductive or conductive material differing from the first electrically semi-conductive or conductive material; and H') implementing step d) on the object membrane obtained after step G');

said process is such that the first nanowire-forming material is a semiconductor material having photovoltaic properties, and the second material forming the other nanowires is a semiconductor material having thermoelectric properties.

The invention also proposes a piezoelectric generator comprising:

a membrane in polarised β-PVDF or polarised PVDF-ETrF copolymer therefore having piezoelectric properties, said membrane having two main outer surfaces separated by a membrane thickness e;

a first layer in an electrically conductive material coating one of the two main outer surfaces of the membrane;

a second layer in an electrically conductive material coating the other of the two main outer surfaces of the membrane;

said membrane, in the thickness thereof, being nanostructured by at least one array of electrically semi-conductive or conductive nanowires e.g. metallic having a surface density of between $10^3$ nanowires/cm$^2$ and $10^{10}$ nanowires/cm$^2$, said nanowires being connected to the first layer but not to the second layer; and said membrane, around the nanowires, comprising damage zones (ZD) left by the passing of heavy ions through the entire thickness of this membrane to create nanopores receiving said nanowires.

This piezoelectric nanogenerator may have the following characteristics, taken alone or in combination:

the membrane, in the thickness thereof, is nanostructured by a first array of electrically semi-conductive or conductive nanowires 15, 15', 15" e.g. metallic, having a surface density of between $10^3$ nanowires/cm$^2$ and $5.10^9$ nanowires/cm$^2$, said nanowires 15, 15', 15" being connected to the first layer 14 but not to the second layer 16, and a second array of electrically semi-conductive or conductive nanowires 150 e.g. metallic having a surface density of between $10^3$ nanowires/cm$^2$ and $5.10^9$ nanowires/cm$^2$, said nanowires 150 of this second array of nanowires 150 being connected to the second layer 16 but not to the first layer 14, said membrane 100 around the nanowires 15, 15', 15", 150, comprising damage zones ZD left by the passing of the heavy ions through the entire thickness of this membrane 100 to create nanopores receiving said nanowires 15, 15', 15", 150 of the two arrays of nanowires 15, 15', 15", 150 ;

the nanowires of the or of at least one of the nanowire arrays are in an electrically conductive material of metal type e.g. Au, Zn, Cu, Co, Ni, Ag or Pt or a metal alloy e.g. formed from the aforementioned metals;

the nanowires of the or of at least one of the nanowire arrays are in semiconductor material having photovoltaic properties e.g ZnO, or thermoelectric properties e.g. $Bi_2Te_3$ or $Sb_2Te_3$.

the nanowires are cylindrical and/or conical;

the cylindrical nanowires have a diameter of between 20 nm and 110 nm;

the surface density of the nanowires of the or of each nanowire array is between $10^3$ nanowires/cm$^2$ and $10^9$ nanowires/cm$^2$, e.g. between $10^6$ nanowires/cm$^2$ and $10^9$ nanowires/cm$^2$;

the thickness e of the membrane may be between 1 μm and 60 μm, for example in the order of 10 μm, particularly 10 μm for β-PVDF and 11 μm for the P(VDF-ETrF) copolymer.

The invention also proposes a device comprising:

a piezoelectric nanogenerator according to the invention;

a capacitor;

means, arranged between the piezoelectric nanogenerator and the capacitor, to transfer the current leaving the piezoelectric nanogenerator towards the capacitor without any possibility of return towards the piezoelectric nanogenerator e.g. a Graetz bridge.

This device may comprise the following characteristics taken alone or in combination:

the capacitor is a nanocapacitor comprising:

a membrane formed of an electrically insulating material, having two main outer surfaces separated by a membrane thickness;

a first layer formed of an electrically conductive material coating one of the two main outer surfaces of the membrane;

a second layer formed of an electrically conductive material coating the other of the two main outer surfaces of the membrane;

said membrane, in the thickness thereof, being nanostructured first by a first array of electrically semi-conductive or conductive nanowires e.g. metallic connected to the first electrically conductive layer but not to the second electrically conductive layer, and secondly by a second array of electrically semi-conductive or conductive nanowires e.g. metallic connected to the second electrically conductive layer but not to the first electrically conductive layer, said nanowires of the first nanowire array and of the second nanowire array being interdigitated;

the membrane of the nanocapacitor is formed of a material selected from among: polycarbonate (PC), alumina ($Al_2O_3$), polyethylene terephthalate (PET) or polyimide (PI), advantageously Kapton®;

the nanowires of either of the first and second array of nanowires are metal nanowires selected from among: Au, Zn, Cu, Co, Ni, Ag, Pt or a metal alloy, in particular formed from the aforementioned metals.

Other characteristics, objectives and advantages of the invention will become apparent on reading the description illustrated by the appended Figures given as examples and in which:

FIG. 1, which includes FIGS. 1(*a*) to 1(*e*), illustrates different intermediate membranes in FIGS. 1(*a*) to 1(*d*) obtained when fabricating a piezoelectric nanogenerator conforming to the invention comprising cylindrical nanowires as illustrated in FIG. 1(*e*);

FIG. 2 includes FIGS. 2(*a*) and 2(*b*), where FIG. 2(*a*) is a schematic illustrating a test device and FIG. 2(*b*) gives test results;

FIG. 3, which includes FIGS. 3(*a*) to 3(*e*), illustrates different intermediate membranes in FIGS. 3(*a*) to 3(*d*) obtained when fabricating a piezoelectric nanogenerator conforming to the invention comprising conical nanowires formed in a membrane having conical nanopores, this nanogenerator being illustrated in FIG. 3(*e*);

FIG. 4, which includes FIGS. 4(*a*) to 4(*e*), illustrates different intermediate membranes in FIGS. 4(*a*) to 4(*d*) obtained when fabricating a piezoelectric nanogenerator conforming to the invention comprising conical nanowires formed in a membrane with bi-conical nanopores, this nanogenerator being illustrated in FIG. 4(*e*);

FIG. 5, which comprises FIGS. 5(a) to 5(e), illustrates different intermediate membranes in FIGS. 5(a) a 5(d) obtained when fabricating a piezoelectric nanogenerator conforming to the invention in one variant of embodiment comprising cylindrical nanowires, this nanogenerator being illustrated in FIG. 5(e);

FIG. 6, which includes FIGS. 6(a) to 6(e), illustrates different intermediate membranes in FIGS. 6(a) to 6(d) obtained when fabricating a piezoelectric nanogenerator conforming to the invention according to another variant of embodiment, comprising cylindrical nanowires, this nanogenerator being illustrated in FIG. 6(e) ;

First, at step a), a membrane 100 is provided in polarised β-PVDF or polarised P(VDF-ETrF) copolymer, said membrane having two main outer surfaces 11, 12 separated by a thickness e of the membrane 100.

Figure 1A:
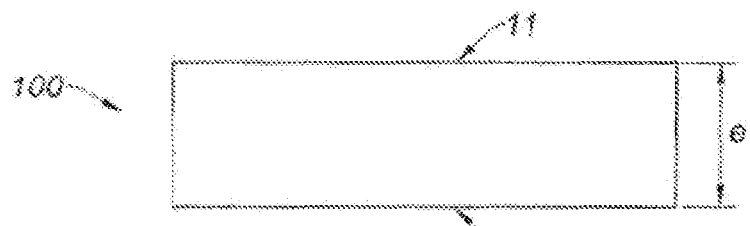
FIG. 1 illustrates the structures obtained after the different steps of a process for fabricating a piezoelectric nanogenerator according to the invention.

Reference can be made to FIG. 1(a).

β-PVDF is a beta phase polyvinylidene fluoride.

The P(VDF-ETrF) copolymer is formed of two monomers: vinylidene difluoride (VDF) and ethylene trifluoride (ETrF). The proportion of the PVDF repeating unit in this copolymer may vary between 60% and 80% in moles, the proportion of the ETrF repeating unit ensuring the remainder i.e. between 20% and 40% in moles. Advantageously a P(VDF-ETrF) copolymer is used with a distribution of 70% (VDF) versus 30% (ETrF) in moles.

The thickness e of the membrane 100 may be between 1 µm and 60 µm, for example in the order of 10 µm, particularly 10 µm for β-PVDF and 11 µm for the P(VDF-ETrF) copolymer.

Next, at step b), the membrane is irradiated via at least one of its two main outer surfaces 11, 12, here surface 11, through the entire thickness e of said membrane 100. This is performed using heavy ions with fluence of between $10^3$ ions/cm$^2$ and $10^{10}$ ions/cm$^2$.

Figure 1B:
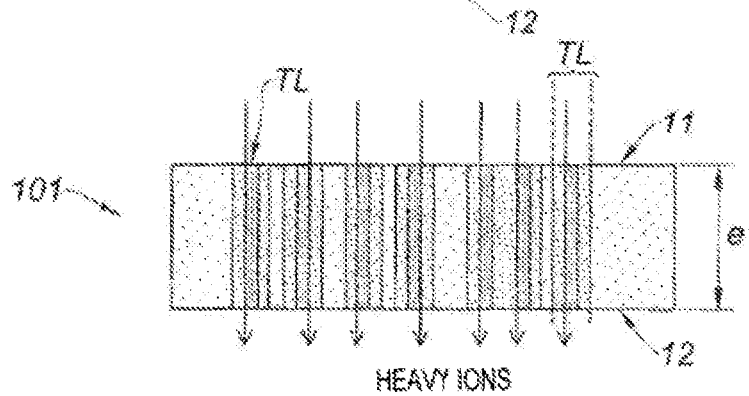

A membrane 101 is then obtained with latent tracks LT left by the passing of the heavy ions through the entire thickness e thereof, and has increased piezoelectric properties compared with the membrane provided at step a). This membrane 101 is illustrated in FIG. 1(b).

The increase in piezoelectric properties is an unexpected effect which will be evidenced with the support of a series tests presented further on.

Advantageously, the fluence of the heavy ions used is between $10^3$ ions/cm$^2$ and $10^9$ ions/cm$^2$. More advantageously, the fluence is between $10^6$ ions/cm$^2$ and $10^9$ ions/cm$^2$, even between $10^7$ and $10^9$ ions/cm$^2$.

To irradiate said membrane 100 through the entire thickness thereof, the energy of the heavy ions is advantageously between 2 MeV/mau and 15 MeV/mau; where «mau» designates a mass atomic unit.

This energy is dependent upon the thickness of the membrane 101 and the chemical nature thereof: β-PVDF or P(VDF-ETrF) copolymer.

It can particularly be obtained with heavy ions of Kr or Xe type, accelerated to obtain this energy level allowing passing through the entire thickness of the membrane.

Advantageously, irradiation is performed in an inert atmosphere e.g. helium. In an inert atmosphere, any potential oxidization is avoided of the radicals created in the membrane by heavy ion irradiation.

Advantageously, as illustrated in FIG. 1(b), irradiation is conducted with a flow of heavy ions perpendicular to one of the main outer surfaces, here surface 11, so that the latent tracks are of cylindrical shape.

Next, at step c), the latent tracks are chemically developed over a predetermined time to main a damage zone belonging to the latent track. It is to be noted that the diameter $D_n$ of the nanopores (nm) varies linear fashion over time (mn) following the equation $D_n = 1.6 \ast t$.

In this example, a case is illustrated in which the cylindrical nanopores pass through the entire thickness of the membrane. However, other shapes can be envisaged for the nanopores e.g. conical or bi-conical as will be detailed below.

Figure 1C:
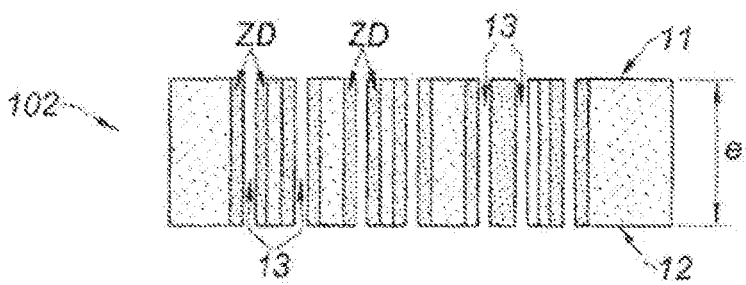

After this step c), a nanostructured membrane 102 is obtained having nanopores 13, here cylindrical, passing through the entire thickness of the membrane 102, with damage zones around each nanopore 13 as illustrated in FIG. 1(c).

The chemical development step can be performed by basic hydrolysis at a temperature of between 40° C. and 75° C. with an aqueous solution of 10 N KOH and 0.25 N KMnO$_4$. Advantageously, base hydrolysis is conducted at between 40° C. and 70° C., preferably at 65° C.

Next, at step d), a layer of electrically conductive material is deposited on one of the main outer surfaces 11, 12 of said membrane 102, here surface 12. This depositing can be performed by cathodic sputtering.

The material used to perform step d) may be an electrically conductive material of metal type. For example, it may be gold (Au), zinc (Zn), copper (Cu), cobalt (Co), nickel (Ni), silver (Ag) or platinum (Pt), or a metal alloy in particular formed from the aforementioned metals.

Next, at step e), an electrically semi-conductive or conductive material is electroplated in the nanopores 13, stopping electroplating before complete filling of the nanopores 13.

Figure 1D:
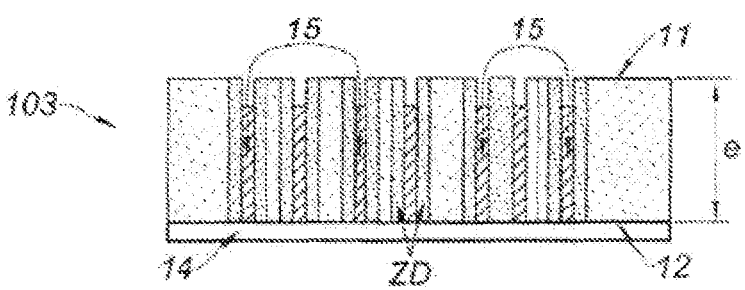
Figure 1E:
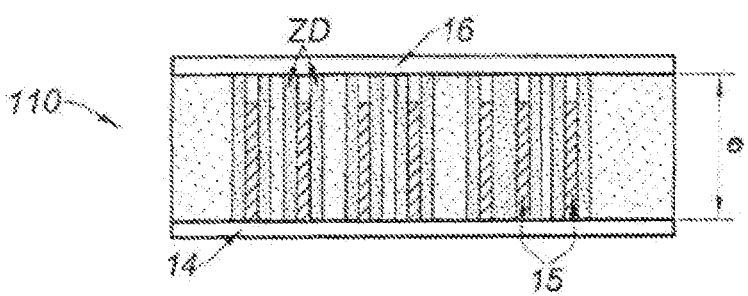

A nanostructured membrane 103 is thus obtained comprising a nanostructured membrane 102 having on one of its main outer surfaces 11, 12, here surface 12, a layer 14 of said electrically conductive material (step d) and nanowires 15 as illustrated in FIG. 1(d). The layer 14 and the nanowires 15 are in one piece. The nanowires 15 do not fill the entire height of the nanopores 13.

The material used to perform electroplating step e) may be an electrically conductive material of metal type. For example, it may be gold (Au), zinc (Zn), copper (Cu), cobalt (Co), nickel (Ni), silver (Ag) or platinum (Pt), or a metal alloy in particular formed from the aforementioned metals. In practice, electroplating step e) can be performed by immersing the nanostructured membrane obtained after step d) in an acid electrolytic bath e.g. of pH 6.2 comprising the metal ions concerned at a concentration of between 10% and 50% by weight.

As a variant, the material used to perform step e) may be a semiconductor material having photovoltaic properties. It is thus possible to define a piezoelectric nanogenerator also having photovoltaic properties. One example of semiconductor material having such photovoltaic properties is zinc oxide (ZnO). ZnO is also of particular interest since it also has piezoelectric properties. In practice, electroplating step e) can then be performed by immersing the nanostructured membrane obtained step d) in an electrolytic bath: 13.6 g/l of ZnO; 25 g/l of KCl (plating voltage: −1200 mV with Ag/AgCl)

According to another variant, it can be envisaged to provide a semiconductor material having thermoelectric properties to carry out step e). A piezoelectric nanogenerator can therefore be defined also having photoelectric properties. One example of semiconductor material having such photoelectric properties is bismuth telluride ($Bi_2Te_3$) or antimony telluride ($Sb_2Te_3$). In practice, electroplating step e) can then be performed by immersing the nanostructured membrane obtained after step d) in an electrolytic bath, for $Bi_2Te_3$: 3.63 g/l of $Bi(NO_3)_3$—$5H_2O$; 1.276 g/l of Te and 64 ml/l of $HNO_3$ (plating voltage: −140 mV with Ag/AgCl), and for $Sb_2Te_3$: 8.7 g/l of $SbCl_3$; 1.276 g/l of Te; 50 g/l of Na-L-tartrate and 64 ml/l of $HNO_3$ (plating voltage: −100 mV with Ag/AgCl).

The use of a semiconductor material having photovoltaic or photoelectric properties has the advantage of providing an additional function to the piezoelectricity of the nanogenerator.

Additionally, the use of a semiconductor material allows an improvement in the performance of the piezoelectric nanogenerator when it is subjected, depending on cases, to illumination or to heat stress.

Finally, at step f), a layer of electrically conductive material is deposited on the other of the main outer surfaces 11, 12 of said membrane 102, here surface 11. This depositing can be performed by cathodic sputtering.

A second layer 16 of said material is thereby defined that is not in contact with the nanowires 15.

The material used to perform f) may be an electrically conductive material of metal type. For example, it may be gold (Au), zinc (Zn), copper (Cu), cobalt (Co), nickel (Ni), silver (Ag) or platinum (Pt), or a metal alloy in particular formed from the aforementioned metals. Metal nanowires 15 are then obtained.

A piezoelectric nanogenerator 1101 such as illustrated in FIG. 1(*e*) is thus obtained 1(*e*).

When in operation, any mechanical action to which the piezoelectric nanogenerator 110 is subjected, will entail the generation of an electric current between the two layers 14, 16.

A piezoelectric nanogenerator was fabricated in accordance with the process detailed in FIG. 1 and its piezoelectric properties were tested for each of the intermediate structures in FIGS. 1(*a*) to 1(*d*) and finally for the piezoelectric nanogenerator itself in FIG. 1(*e*).

More specifically, five membranes were tested.

A first membrane (M1) corresponding to membrane 100 (FIG. 1(*a*)) formed of polarised β-PVDF coated with a gold layer on each of the main outer surfaces 11, 12, for measurement purposes (100 nm for each gold layer). The membrane was supplied by Piezotech.

A second membrane (M2) corresponding to membrane 101 (FIG. 1(*b*)) coated with a gold layer on each of the main outer surfaces 11, 1, for measurement purposes (100 nm for each gold layer). The membrane 100 was supplied by Piezotech. Irradiation of the membrane 100 was performed using energy of 10 MeV/mau with Kr ($Kr^{36+}$) ions, at the GANIL laboratory (Caen, FRANCE), and with fluence of $10^9$ ions/$cm^2$.

A third membrane (M3) corresponding to membrane 102 (FIG. 1(*c*)) coated with a gold layer on each of the main outer surfaces 11, 12 for measurement purposes (100 nm for each gold layer). The membrane 100 was supplied by Piezotech. Irradiation of membrane 100 was performed using energy of 10 MeV/mau with Kr ($Kr^{36+}$) ions, at the GANIL laboratory and with fluence of $10^9$ ions/$cm^2$. Chemical development was performed by base hydrolysis with an aqueous solution of 10 N KOH and 0.25 N $KMnO_4$ at a temperature of 65° C. This chemical development allowed cylindrical nanopores to be formed in the irradiated βPVDF, over a period of time allowing nanopores of diameter 70 nm to be obtained (cf. equation $D_n=1{,}6*t$).

A fourth membrane (M4) corresponding to the piezoelectric nanogenerator 110 (FIG. 1(*e*)) coated with a gold layer 14, 16 on each of the main outer surfaces 11, 12 for measurement purposes (100 nm for each gold layer). The membrane 100 was supplied by Piezotech. Irradiation of the membrane 100 was performed using energy of 10 MeV/mau with Kr ($Kr^{36+}$) ions, at the GANIL laboratory and with fluence of $10^9$ ions/$cm^2$. Chemical development was performed by base hydrolysis with an aqueous solution of 10 N KOH and 0.25 N $KMnO_4$ at a temperature of 65° C. This chemical development allowed the forming of cylindrical nanopores in the irradiated βPVDF over a period of time allowing nanopores to be obtained of diameter 70 nm (cf. equation $D_n=1{,}6*t$). The nanopores were filled with nickel by electroplating (electrolytic bath of pH=6.2, comprising nickel ions).

A fifth membrane (M5) corresponding to the piezoelectric nanogenerator 110 (FIG. 1(*e*)) coated with a gold layer 14, 16 on each of the main outer surfaces 11, 12 for measurement purposes (100 nm for each gold layer). The membrane 100 was supplied by Piezotech. Irradiation of membrane 100 was performed using energy of 10 MeV/mau with Kr ($Kr^{36+}$) ions, at the GANIL laboratory and with fluence de $10^9$ ions/$cm^2$. Chemical development was performed by base hydrolysis with an aqueous solution of 10 N KOH and 0.25 N $KMnO_4$, at a temperature of 65° C. This chemical development allowed cylindrical nanopores to be formed in the irradiated βPVDF over a period of time allowing nanopores of diameter 70 nm to be obtained (cf. equation $D_n=1{,}6*t$). The nanopores were filled with copper by electroplating (electrolytic bath of pH=6,2 comprising copper ions).

Figure 2A:
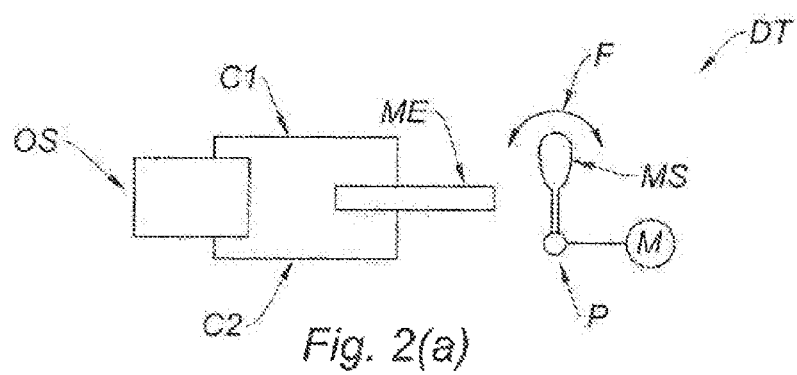
Figure 2B:
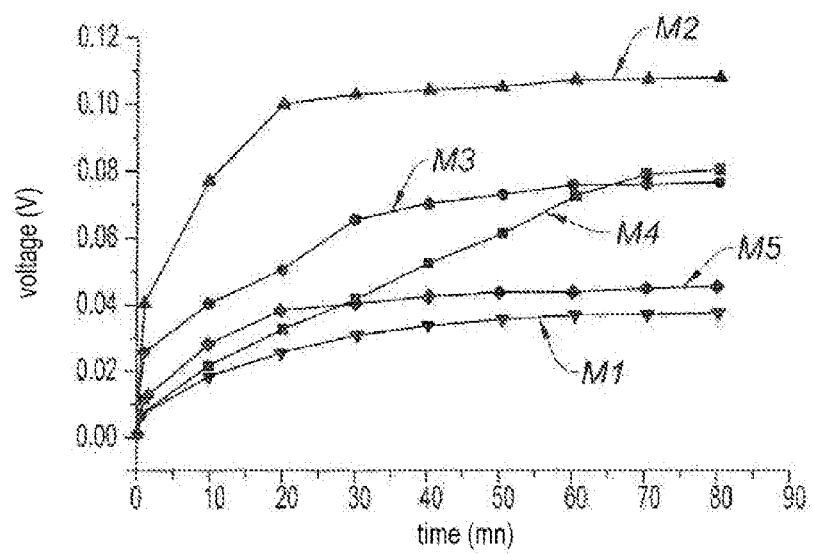

Each of these five membranes M1 to M5 was installed in a test device DT such as illustrated in FIG. 2(*a*).

The membrane ME, representing membranes M1 to M5, was connected via the gold layers and electrical connections C1 and C2 to an oscilloscope OS. Throughout the test, it was subjected to mechanical action repeated at a frequency of 125 rpm (≅2,083 Hz) using a striker MS mounted on a pivoting shaft P connected to a motor set at this frequency. The striker was arranged relative to the membrane ME so as to strike this membrane ME being tested at this frequency, in a back-and-forth movement around its axis of rotation defined by the pivot P, this back-and-forth movement being represented by the two-way arrow F. This test device DT ensured that the membrane was subjected to identical mechanical action on each strike of the striker MS.

It was then possible to determine the voltage delivered by the tested membrane (oscilloscope) under the mechanical action of the striker.

The test results are given in FIG. 2(*b*).

In this FIG. 2(*b*), the voltage is shown that was recorded at the terminals of the tested membrane as a function of time. The duration of each test was limited to 80 mn.

Curve M1 (membrane M1) evidences the piezoelectric properties of the commercial membrane.

Curve M2 (membrane M2) shows the effect of irradiation on the electrical properties of the membrane. By comparing the curves M1 and M2, it is observed that irradiation improves the piezoelectric properties of the membrane by a factor of at least three.

The increase in piezoelectric properties is therefore related to the fluence of the heavy ions irradiating the membrane 100. It is estimated that with fluence strictly lower than $10^3$ ions/cm$^2$, improvement in the piezoelectric properties of the membrane is not significant. Also, it is estimated that with fluence strictly higher than $10^{10}$ ions/cm$^2$, the piezoelectric properties of the membrane are degraded.

Curve M3 (membrane M3) shows the effect obtained when part of the damage zone is removed that was generated by the passing of heavy ions (latent tracks) through the membrane to form the nanopores. In comparison with curve M2, there is loss of piezoelectric properties. However, when comparing with curve M1, the gain in piezoelectric properties remains in the order of twice higher. The removal of matter from the piezoelectric membrane therefore does have the consequence of reducing or maintaining piezoelectric properties in relation to membrane M1.

The inventors consider that this is related to the damage zones created by irradiation and which still remain around each of the nanopores.

Finally, curves M4 (membrane M4) and M5 (membrane M5) show that the formation of nanowires allowed the maintaining of a substantial gain in piezoelectric properties compared with membrane M1, irrespective of the metal material used to fill the nanopores.

It is ascertained however that the gain is dependent on the type of metal material under consideration.

With nickel, the performance level after the tests was more or less similar to that obtained with membrane M3, namely gain of a factor of two compared with membrane M1. With copper, the gain is in the order of only 10 to 15% compared with membrane M1.

As previously specified, the nanowires may have a shape other than a cylindrical shape.

For example, the nanopores and subsequently the nanowires may have a conical shape.

The conical shape is more advantageous from a mechanical viewpoint. This may be of advantage since the piezoelectric nanogenerator is intended to be subjected to mechanical stresses.

FIGS. 3(a) to 3(e) illustrate the fabrication of a piezoelectric nanogenerator having conical nanowires 15'.

Figure 3A:
Figure 3B:
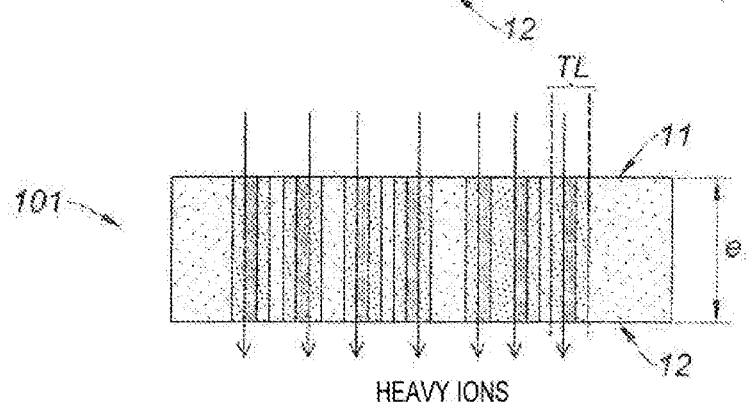
Figure 3C:
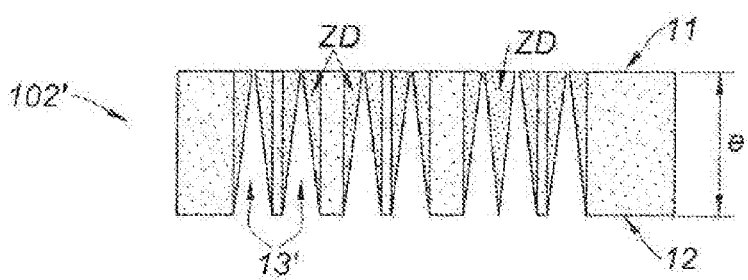
Figure 3D:
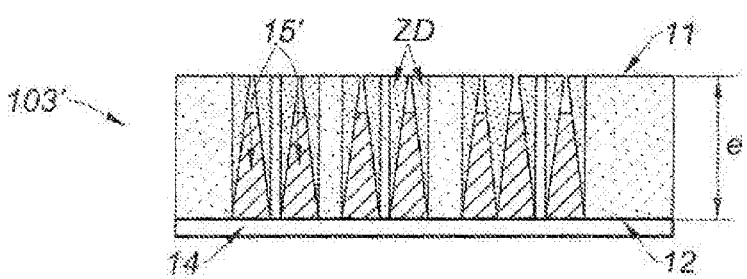
Figure 3E:
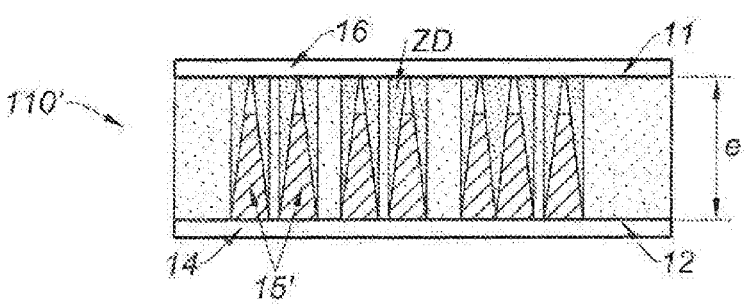
Figure 4A:
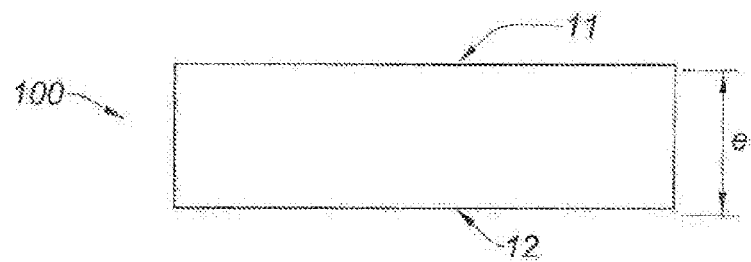
Figure 4B:
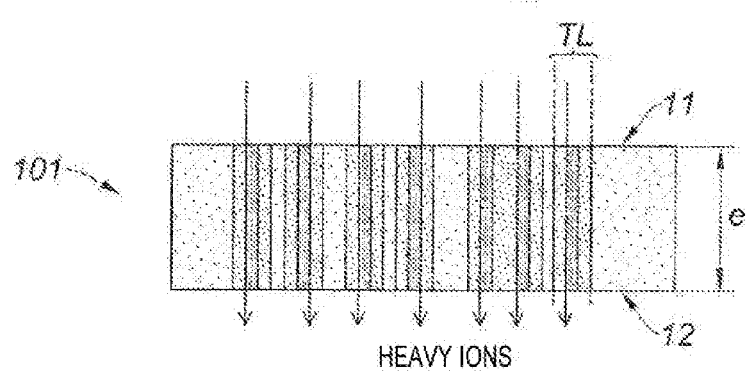
Figure 4C:
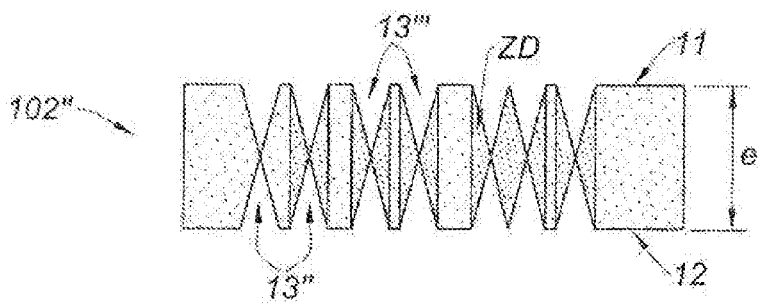
Figure 4D:
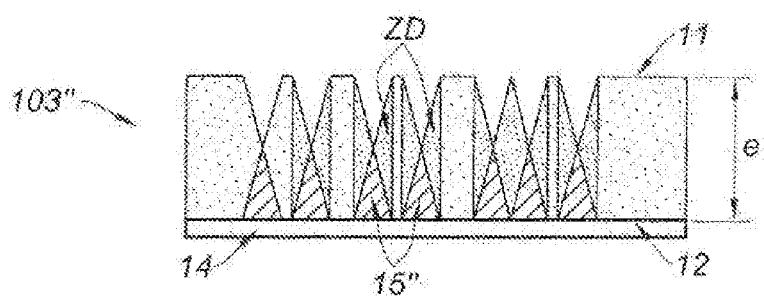
Figure 4E:
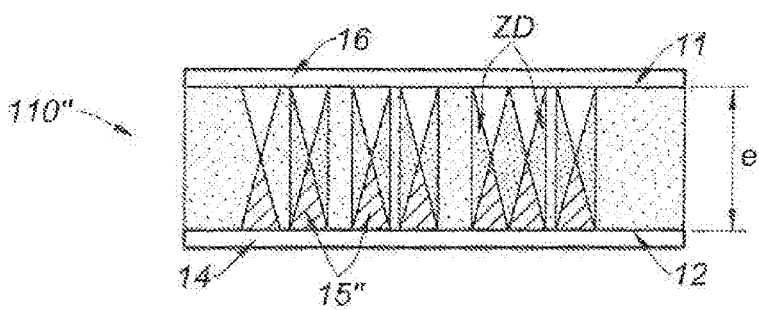

The fabrication process is similar to the process described in connection with FIGS. 1(a) to 1(e). The difference in structure between the piezoelectric nanogenerator 110' in FIG. 3(e) and the one in FIG. 1(e) derives from the chemical development step, as can be observed by comparing the nanostructured membranes 102', 102 in FIGS. 3(c) and 1(c), respectively. FIG. 3(d) showing the intermediate structure 103' is to be compared with the intermediate structure 103 in FIG. 1(d).

In general, to control the shape of the nanopores 13, 13', two major aspects are involved: the type of material forming the membrane 100 and the conditions of chemical development, namely—regarding base hydrolysis for example, the composition of the solution used for this base hydrolysis.

For a conical shape, chemical attack should be performed via one surface 11 only of the main outer surfaces 11, 12.

Obtaining a conical shape is easier with the P(VDF-ETrF) copolymer than with βPVDF, although it is possible with βPVD by adapting the solution used for base hydrolysis.

FIGS. 4(a) to 4(e) illustrate the fabrication of a piezoelectric nanogenerator having bi-conical nanopores 13".

The fabrication process is similar to the process described in connection with FIGS. 1(a) to 1(e). The difference in structure between the piezoelectric nanogenerator 110" in FIG. 4(e) and the one in FIG. 1(e) derives from the chemical development step, as can be observed by comparing the nanostructured membranes 102", 102 in FIGS. 4(c) and 1(c), respectively. FIG. 3(d) showing the intermediate structure 103" is to be compared with the intermediate structure 103 in FIG. 1(d).

Compared with FIGS. 3(a) to 3(e), chemical development is performed by attack via the two main outer surfaces 11, 12 of the membrane, as can be the case when it is sought to form cylindrical nanopores.

When fabricating the nanowires, it can be chosen only to fill some nanopores e.g. the nanopores opening into one 12 of the main outer surfaces 11, 12 of membrane 102". This is illustrated in the appended Figures.

Provision could also be made, however, to fill one part of the nanopores 13"', only one part to ensure that the nanowires 15" are not in contact with layer 16.

Obtaining a bi-conical shape is easier with the P(VDF-ETrF) copolymer than with βPVDF, although it is possible with βPVDF by adapting the composition of the solution used for base hydrolysis.

At mechanical level, there is no fundamental difference between a conical shape and a bi-conical shape. However, the bi-conical shape is generally easier to fabricate than the conical shape insofar as chemical development (attack) is performed simultaneously on the two surfaces of the membrane. As a result, no strategy of attack needs to be adopted and mere immersion of the membrane in the bath is sufficient to allow development.

In the foregoing description we considered the case in which all the nanowires were formed of one same material, whether metal or semiconductor.

It is possible to modify the fabrication process to obtain a piezoelectric nanogenerator having nanowires formed of different materials.

This process reproduces all the steps a) to f) described previously, but also comprises additional steps.

More specifically, this fabrication process implements the following steps:

A) implementing steps a) to e), where step b) is performed with fluence of between $10^3$ ions/cm$^2$ and $5.10^9$ ions/cm$^2$, preferably between $10^3$ ions/cm$^2$ and $10^8$ ions/cm$^2$, and electroplating step e) forming nanowires 15 formed of a first electrically semi-conductive or conductive material;

B) repeating steps b) and c), which allows the forming of other nanopores 130, step b) being performed with fluence of between $10^3$ ions/cm$^2$ and $5.10^9$ ions/cm$^2$, preferably between $10^3$ ions/cm$^2$ and $10^8$ ions/cm$^2$;

C) removing the layer 14 in electrically conductive material deposited at step d);

D) implementing step f), with the result that a layer 16 in electrically conductive material is defined that is not in contact with the nanowires, on one main outer surface of said membrane;

E) repeating electroplating step e) to form nanowires 150 in said other nanopores 130 with a second electrically semi-conductive or conductive material differing from the first electrically semi-conductive or conductive material;

F) repeating step d).

This fabrication process will be called «double irradiation» in the remainder of the description.

Compared with the fabrication process described in connection with FIG. 1, the additional steps are steps B), C), E) and F). Steps B) and C) are performed between steps e) and f). Steps E) and F) are performed after step f).

As can be seen, steps A), B), D), E) and F) are performed under similar conditions to those of steps a) to f). Regarding step C), the removal of the electrically conductive material deposited at step d) is particularly easy. The reason is that, after step B), chemical development partly peels off the layer of electrically conductive material deposited at step d) and mere mechanical-chemical polishing e.g. with ethanol is sufficient to remove this layer.

For better understanding of this fabrication process, reference can be made to FIG. 5 which includes FIGS. 5(a) to 5(e). It will be noted that for reasons of simplification of the appended Figures, the latent tracks TL left by passing of the heavy ions through the membrane and the damage zones ZD remaining after chemical development are not illustrated in these Figures contrary to FIGS. 1, 3 and 4.

Figure 5A:
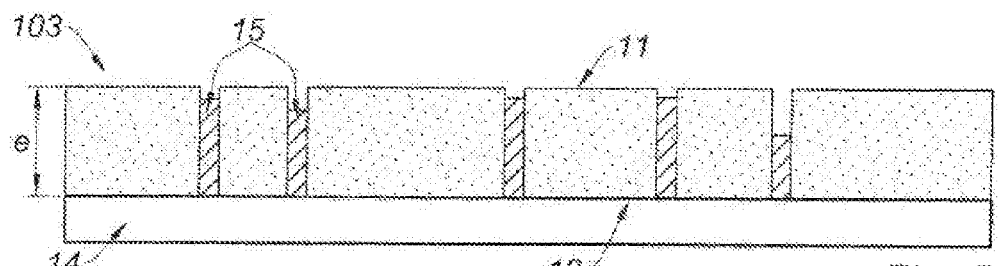

FIG. 5(a) illustrates the membrane obtained after step A). This membrane therefore corresponds to the one illustrated in FIG. 1(d).

Figure 5B:
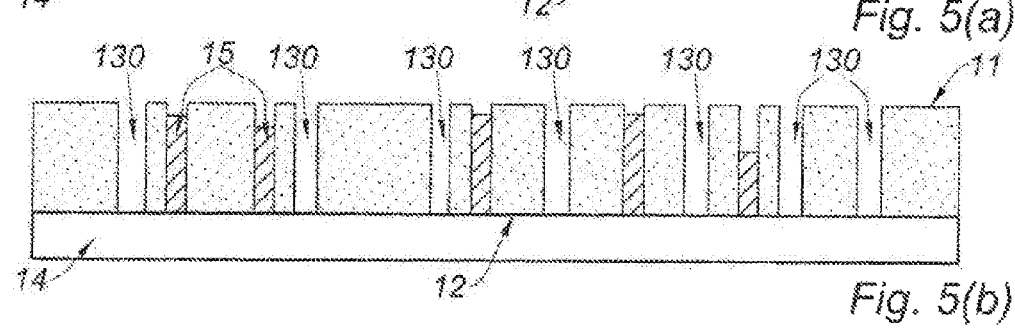
Figure 5C:
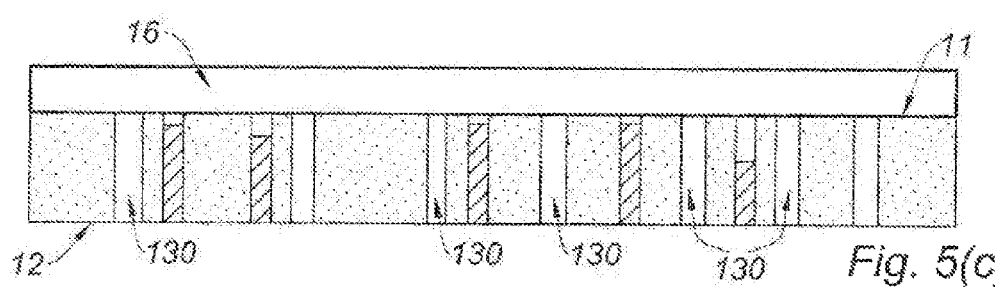
Figure 5D:
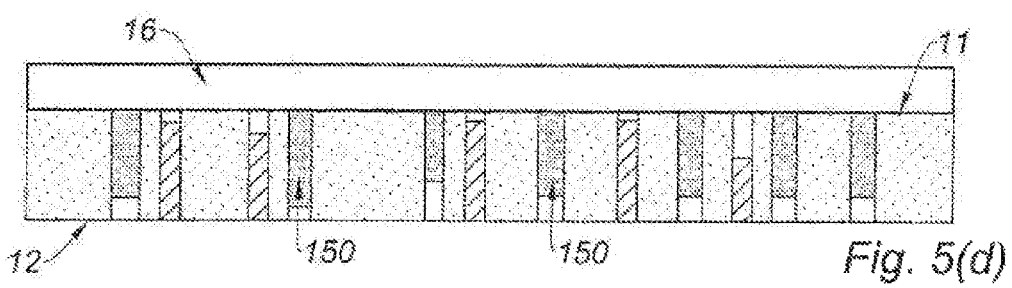
Figure 5E:
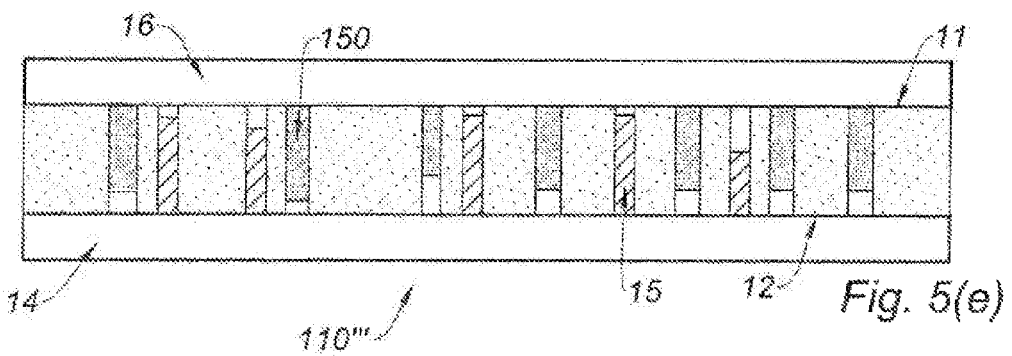

FIG. 5(b) illustrates the membrane obtained after step B).
FIG. 5(c) illustrates the membrane obtained after step D).
FIG. 5(d) illustrates the membrane obtained after step E).
Finally, FIG. 5(e) illustrates the piezoelectric nanogenerator 110''' finally obtained after implementing step F).

This fabrication process is of particular interest when it is desired to deposit nanowires having photovoltaic properties (e.g. ZnO, at step A)) and nanowires having thermoelectric properties (e.g. $Bi_2Te_3$ or $Sb_2Te_3$, at step E)).

Evidently, provision could be made to deposit the same materials at steps A) and E). This would be of limited advantage however since, in this case, the fabrication process according to steps a) to e) would be quicker.

It is also possible to propose another fabrication process to obtain a piezoelectric nanogenerator having nanowires formed of different materials and therefore providing the same advantages.

More specifically, this other fabrication process of a piezoelectric nanogenerator uses the following steps:

A') implementing steps a) to d), step a) being performed with a first membrane called source membrane MSO;

B') implementing steps a) to c), step a) being performed with another membrane called object membrane MOB;

C') arranging the object membrane obtained after step B') on the source membrane obtained after step A');

D') implementing step e), this electroplating step allowing the partial filling of each of the nanopores 13 formed by the association of at least one nanopore of the object membrane obtained after step B'), said nanopore being superimposed over at least one nanopore of the source membrane obtained after step A') to form nanowires 15 formed of a first electrically semi-conductive or conductive material, the other nanopores 130 not being filled;

E') separating the two membranes from one another;

F') implementing step f) on the object membrane obtained after step E') with the result that an electrically conductive layer 16 is defined that is not in contact with the nanowires, on one main outer surface of said membrane;

G') implementing electroplating step e) on the object membrane obtained after step F') to form nanowires 150 in said other nanopores 130 with a second electrically semi-conductive or conductive material differing from the first electrically semi-conductive or conductive material;

H') implementing step d) on the object membrane obtained after step G').

As can be seen, the source membrane is only used to act as « mask at step D'). The nanopores of the object membrane which do not communicate with the nanopores of the source membrane after step C') cannot be filled by electroplating since these nanopores of the object membrane cannot see the layer of the source membrane obtained after step B') (step c)) which acts as reference electrode to carry out electroplating. Once the membranes are separated, the source membrane is no longer involved in the fabrication process.

This is the reason why this variant will be called a « masking fabrication process in the remainder of the description.

For better understanding of this fabrication process, reference can be made to FIG. 6, which includes FIGS. 6(a) to 6(e). It will be noted that for reasons of simplification of the appended Figures, the latent tracks TL left by passing of the heavy ions through the membrane and the damage zones ZD remaining after chemical development are not illustrated in these Figures, contrary to FIGS. 1, 3 and 4.

Figure 6A:
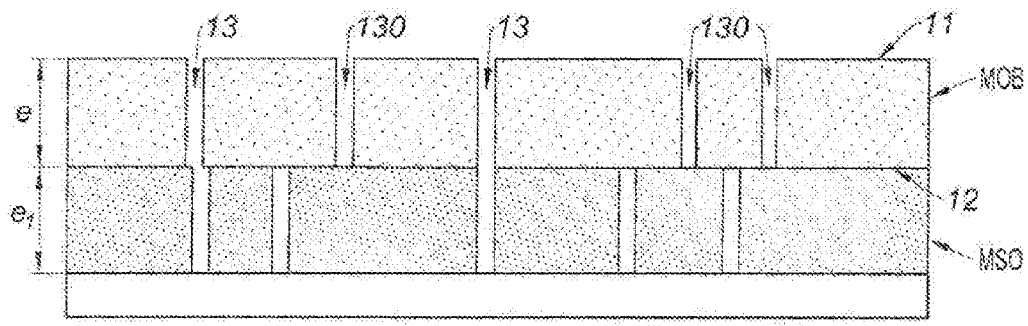

FIG. 6(a) illustrates the association of the two membranes: source membrane acting as « mask » on which the object membrane is positioned which will allow obtaining of the piezoelectric nanogenerator obtained after step C').

Figure 6B:
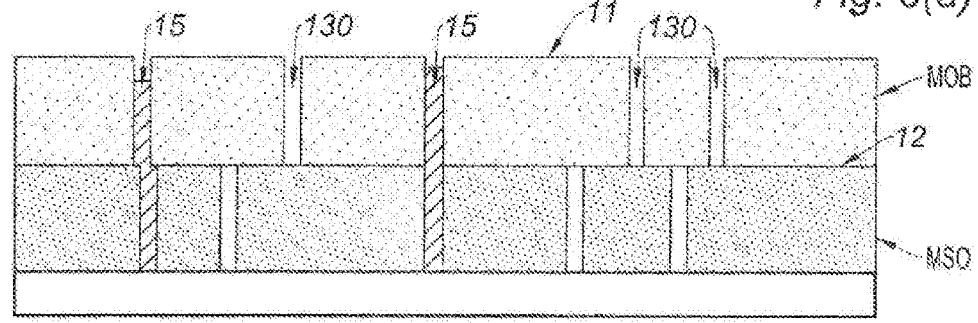

FIG. 6(b) illustrates the membrane obtained after step D').

Figure 6C:
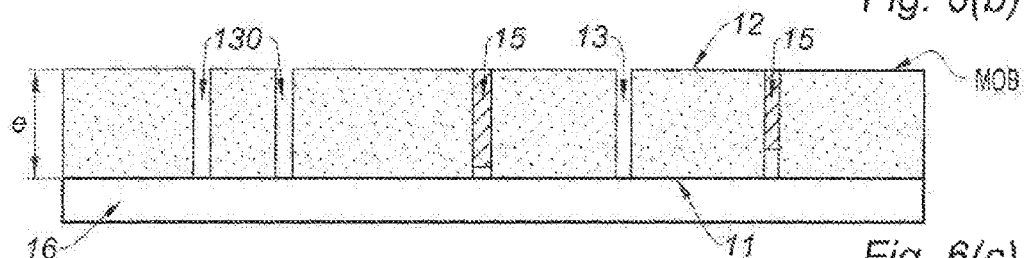

FIG. 6(c) illustrates the object membrane obtained after step F'). It is to be noted that the membrane illustrated in this FIG. 6(c) is similar to the one illustrated in FIG. 5(c).

Figure 6D:
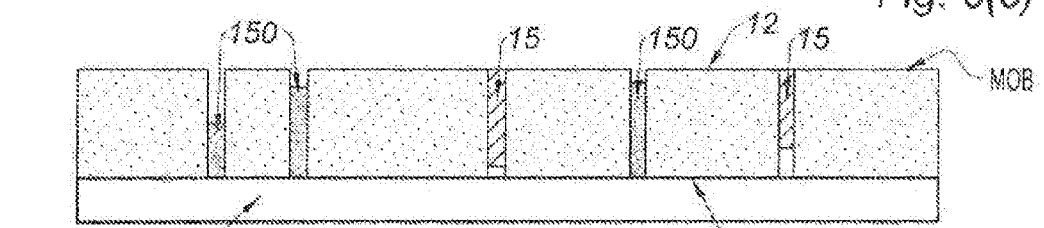

FIG. 6(d) illustrates the object membrane obtained after step G'). It is to be noted that the membrane illustrated in this FIG. 6(d) is similar to the one illustrated in FIG. 5(d).

Figure 6E:
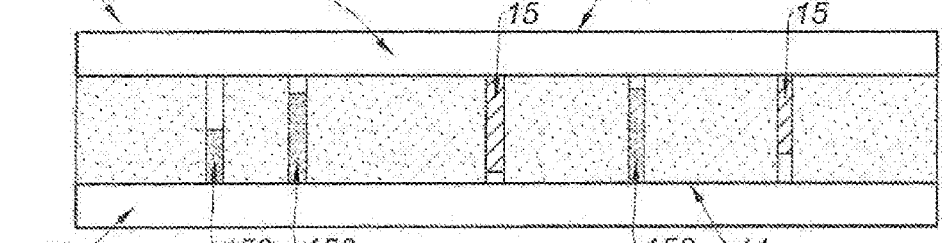

Finally, FIG. 6(e) illustrates the piezoelectric nanogenerator 110'''' finally obtained after implementing step H'). This piezoelectric nanogenerator 110'''' is similar to the one illustrated in FIG. 5(e).

Irrespective of the process for fabricating a piezoelectric nanogenerator such as previously described, it is possible, after obtaining this piezoelectric nanogenerator i.e. after step f), F) or H') depending on the fabrication process under consideration, to envisage performing additional irradiation under the conditions of step b). In this case, it must be ensured however before initiating such irradiation, that having regard to the irradiation performed at step b) and to this additional irradiation, the membrane will not finally be subjected to heavy ion irradiation with fluence strictly higher than $10^{10}$ ions/cm$^2$. For example, if at step b), fluence was $10^9$ ions/cm$^2$, it is fully possible to carry out additional irradiation with identical fluence. In practice, additional irradiation will be envisaged with heavy ions at a fluence of between $10^7$ ions/cm$^2$ and $10^8$ ions/cm$^2$.

The invention also relates to a piezoelectric nanogenerator able to be obtained with the fabrication process of the invention, irrespective of the variant under consideration (FIG. 1, 3, 4, 5 or 6). In particular, it will be noted that the fluence of the heavy ions will entail a corresponding surface density of nanopores, namely most generally between $10^3$ and $10^{10}$ nanowires/cm$^2$.

More specifically, the invention proposes a piezoelectric nanogenerator 110, 110', 110'', 110''', 110'''' comprising:

a membrane 100 in polarised β-PVDF or polarised PVDF-ETrF copolymer therefore having piezoelectric properties, said membrane 100 having two main outer surfaces 11, 12 separated by a membrane thickness e;

a first layer 14 formed of electrically conductive material coating one 11 of the two main outer surfaces of the membrane 100;

a second layer 16 formed of electrically conductive material coating the other 12 of the two main outer surfaces of the membrane 100;

said membrane 100, in the thickness thereof, being nanostructured by at least one array of electrically semi-conductive or conductive nanowires 15, 15', 15'' e.g. metallic having a surface density of between $10^3$ nanowires/cm² and $10^{10}$ nanowires/cm², said nanowires 15, 15', 15" being connected to the first layer 14 but not to the second layer 16, and said membrane around the nanowires 15, 15', 15"comprising damage zones ZD left by passing of heavy ions through the entire thickness of this membrane 100 to create nanopores receiving said nanowires.

As a result, this piezoelectric nanogenerator 110, 110', 110", 110''', 110'''' has increased piezoelectric properties compared with a non-irradiated piezoelectric nanogenerator.

The piezoelectric nanogenerator 110, 110', 110", 110''', 110'''' may also be such that the membrane 100, in the thickness thereof, is nanostructured by:

a first array of electrically semi-conductive or conductive nanowires 15, 15', 15" e.g. metallic having a surface density of between $10^3$ nanowires/cm² and $5.10^9$ nanowires/cm², said nanowires 15, 15', 15 being connected to the first layer 14 but not to the second layer 16;

a second array of electrically semi-conductive or conductive nanowires 150 e.g. metallic having a surface density of between $10^3$ nanowires/cm² and $5.10^9$ nanowires/cm², said nanowires 150 of this second array of nanowires 150 being connected to the second layer 16 but not to the first layer 14, said membrane 100, around the nanowires 15, 15', 15", 150, comprising damage zones ZD left by passing of heavy ions through the entire thickness of this membrane 100 to create nanopores receiving said nanowires 15, 15', 15', 150 of the two arrays of nanowires 15, 15', 15", 150.

In this case, advantageously the processes described with reference to FIG. 5 («double irradiation») and FIG. 6 («masking») are implemented.

The shape of the nanowires 15, 15', 15", 150 of this piezoelectric nanogenerator may be cylindrical and/or conical.

When the nanowires 15, 15', 15", 150 are cylindrical, they may have a diameter of between 20 nm and 110 nm.

The surface density of the nanowires 15, 15', 15", 150 of the or of each array of nanowires is between $10^3$ nanowires/cm² and $10^9$ nanowires/cm², for example between $10^6$ nanowires/cm² and $10^9$ nanowires/cm².

The thickness e of the membrane 100 may be between 1 µm and 60 µm, for example in the order of 10 µm, in particular 10 µm for β-PVDF and 11 µm for the P(VDF-ETrF) copolymer.

On the other hand, there is no a priori limitation regarding the width and length of the membrane and hence of the piezoelectric nanogenerator of the invention. The term «nano»in «nanogenerator» relates to the dimension of the pores.

The invention also relates to a device 400 comprising:
a piezoelectric nanogenerator 110, 110', 110", 110'''' conforming to the invention;
a capacitor 200;
means 300, arranged between the piezoelectric nanogenerator and the capacitor 200, to transfer the current leaving the piezoelectric nanogenerator 110, 110', 110", 110''' towards the capacitor 200 without any possibility of return towards the piezoelectric nanogenerator.

The means 300 may be a Graetz bridge, more generally known as a diode bridge.

Figure 7:
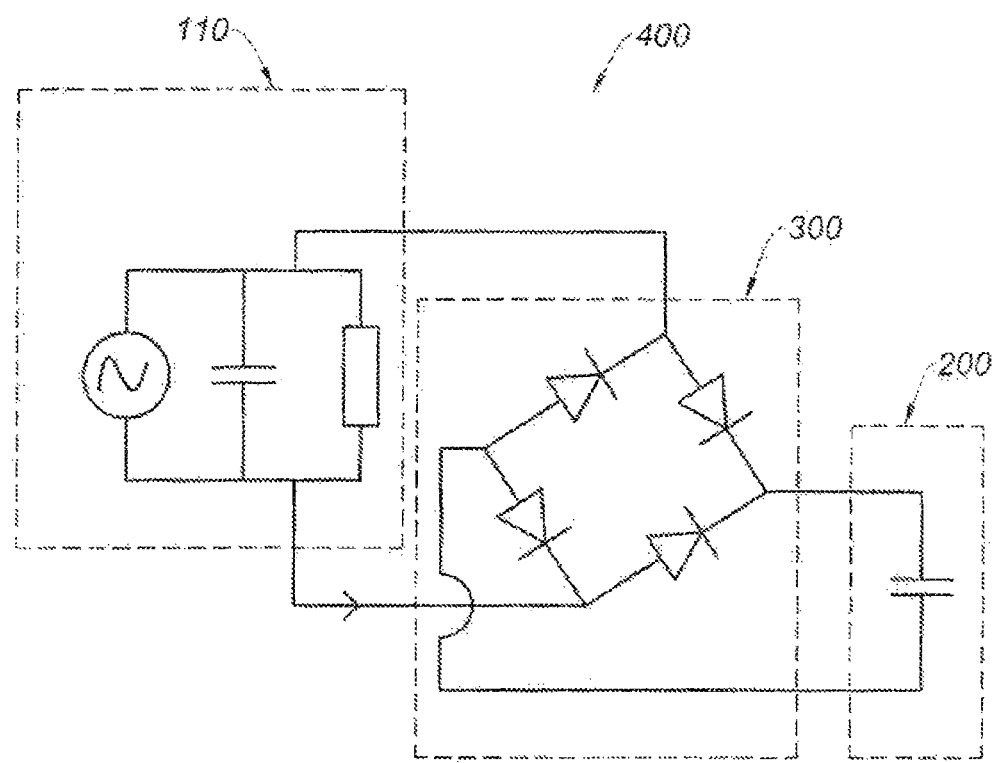
FIG. 7 illustrates a device comprising a piezoelectric nanogenerator conforming to the invention and a capacitor to store the energy produced by the nanogenerator.

The device 400 is illustrated in FIG. 7.

Figure 8:
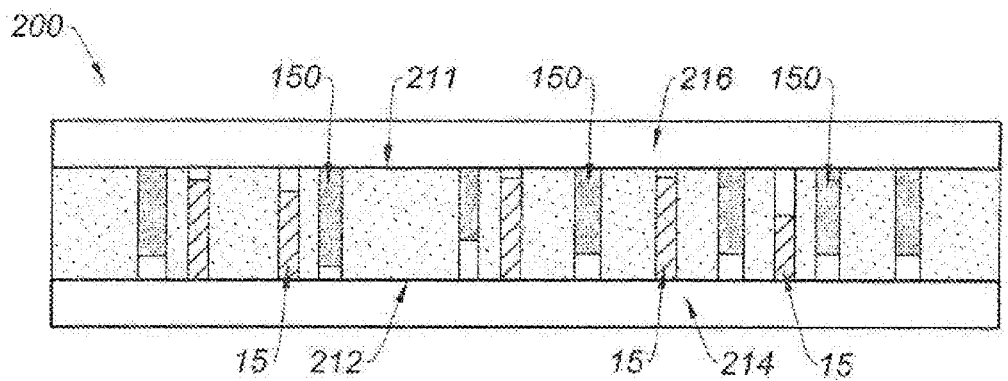
FIG. 8 illustrates the structure of a nanocapacitor able to be used in the device illustrated in FIG. 7.

Advantageously, the capacitor 200 is of particular design, namely a design based on an electrically insulating, nanostructured membrane as illustrated in FIG. 8, thereby forming a nanocapacitor.

More specifically the nanocapacitor 200 may comprise:
a membrane 210 formed of an electrically insulating material having two main outer surfaces 211, 212 separated by a membrane thickness;
a first layer 214 formed of an electrically conductive material coating one 212 of the two main outer surfaces of the membrane 210;
a second layer 216 formed of an electrically conductive material coating the other 211 of the two main outer surfaces of the membrane 210;
said membrane 210, in the thickness thereof, being nanostructured first by a first array of electrically semi-conductive or conductive nanowires 15 e.g. metallic connected to the first electrically conductive layer 214 but not to the second electrically conductive layer 216, and secondly by a second array of electrically semi-conductive or conductive nanowires 150 e.g. metallic (represented by hatching in FIG. 8), connected to the second electrically conductive layer 216 but not to the first electrically conductive layer 214, said nanowires 15, 150 of the first array of nanowires and second array of nanowires being interdigitated.

In its structure, the nanocapacitor 200 is similar to the piezoelectric nanogenerator illustrated in FIG. 5(e) or 6(e), except that the membrane used at step a) is electrically insulating.

The membrane of the nanocapacitor 200 may be formed in a material selected from among: polycarbonate (PC), alumina ($Al_2O_3$), polyethylene terephthalate (PET) or polyimide (PI), advantageously Kapton®.

The nanocapacitor 200 can therefore be obtained with the fabrication process called «double irradiation», by implementing steps A) to F).

As a variant, the nanocapacitor 200 can also be obtained with the fabrication process called «masking», in this case implementing steps A') to H').

However, for fabricating the nanocapacitor 200 whether by «double irradiation» or «masking», it is not compulsory during the fabrication process to use fluence of the heavy ions in the range of $10^3$ ions/cm² to $10^{10}$ ions/cm², nor is it necessary to control chemical development to maintain damage zones of the latent tracks left in the membrane by irradiation with heavy ions. Since the membrane of the nanocapacitor is electrically insulating, it is in no way sought to modify piezoelectric properties. As a result, it is not necessary either to provide for nanowires formed of two different materials.

The nanocapacitor 200 thus obtained has very high surface capacitance related to the presence of interdigitated nanowires. The inventors were able to observe that this interdigitation of the nanowires allows a substantial increase in the capacitance of the nanocapacitor.

Interdigitation derives from the fact that the nanowires of the first array of electrically semi-conductive or conductive nanowires connected to the first electrically conductive layer but not to the second electrically conductive layer, and the nanowires of the second array of electrically semi-conductive or conductive nanowires connected to the second electrically conductive layer but not to the first electrically conductive layer, are arranged facing one another.

In other words, the nanocapacitor 200 is not formed of a first array of nanowires positioned on one side e.g. the left side of the nanocapacitor, and of a second array of nanowires positioned on the other side e.g. the right side of the nanocapacitor (=non-interdigitated).

In this respect, the nanowires forming the two arrays of nanowires of the nanocapacitor 200 may be the same or different.

The metal nanowires of either of the first and second array of nanowires can be selected from among: Au, Zn, Cu, Co, Ni, Ag, Pt, or a metal alloy in particular formed from the aforementioned metals.

It will be noted that regarding the piezoelectric nanogenerator 110''', 110'''' illustrated in FIGS. 5(e) and 6(e), interdigitation is not compulsory. For the needs of the description we have nevertheless illustrated piezoelectric nanogenerators having interdigitation.

Finally, it is to be noted that the invention could also relate to a process for fabricating a nanocapacitor, either of «double irradiation» type (FIG. 5), or of «masking» type (FIG. 6), and to said nanocapacitor.

Therefore, the invention could relate to a process for fabricating a nanocapacitor, comprising the following steps A'') to F''):

A'') implementing the following sub-steps:
  a'') providing a membrane in electrically insulating material, said membrane having two main outer surfaces 11, 12 separated by a membrane thickness e;
  b'') irradiating said membrane via at least one of its two main outer surfaces (11, 12) through the entire thickness of said membrane, with heavy ions, after which a membrane is obtained having latent tracks left by passing of the heavy ions through the entire thickness thereof;
  c'') performing chemical development of the latent tracks over a predetermined time to maintain a damage zone belonging to the latent track, after which a membrane nanostructured with nanopores is obtained comprising a damage zone around each nanopore;
  d'') depositing a layer 14 of electrically conductive material on one 12 of the two main outer surfaces 11, 12 of said membrane;
  e'') electroplating an electrically semi-conductive or conductive material in the nanopores, stopping electroplating before complete filling of the nanopores, after which a membrane 103 is obtained nanostructured with nanowires 15 partly filling the nanopores;
B'') repeating the sub-steps b'') and c''), allowing other nanopores 130 to be formed;
C'') removing the layer 14 of electrically conductive material deposited at step d'');
D'') depositing a layer of electrically conductive material on the other 11 of the two main outer surfaces 11, 12, so that a layer 16 of electrically conductive material is defined that is not in contact with the nanowires 15, on a main outer surface of said membrane;
E'') repeating electroplating step e'') to form other nanowires 150 in said other nanopores 130;
F'') repeating step d'').

As a variant, the invention could relate to a process for fabricating a nanocapacitor, comprising the following steps A''') to H'''):

A''') implementing the following sub-steps:
  a''') providing a first membrane in electrically insulating material, called source membrane MSO, said source membrane MSO having two main outer surfaces 11, 12 separated by a membrane thickness $e_1$;
  b''') irradiating said source membrane MSO via at least one of its two main outer surfaces through the entire thickness of said source membrane, with heavy ions, after which a source membrane MSO is obtained having latent tracks left by passing of the heavy ions through the entire thickness thereof;
  c''') performing chemical development of the latent tracks, after which a nanostructured membrane is obtained;
  d''') depositing a layer 14 of electrically conductive material on one 12 of the two main outer surfaces 11, 12 of said membrane;
B''') implementing steps a''') to c'''), step a''') being performed with another membrane called object membrane MOB;
C''') arranging the object membrane obtained after step B''') on the source membrane obtained after step A''');
D''') implementing step e'''), this electroplating step allowing the partial filling of each of the nanopores 13 formed by the association of at least one nanopore of the object membrane obtained after step B'''), said nanopore being superimposed over at least one nanopore of the source membrane obtained after step A''') to form nanowires 15 formed of a first electrically semi-conductive or conductive material, the other nanopores 130 not being filled;
E''') separating the two membranes from one another;
F''') depositing a layer 16 of electrically conductive material on the other 11 of the two main outer surfaces 11, 12 of the object membrane obtained after step E'''), so that an electrically conductive layer is defined that is not in contact with the nanowires 15;
G''') implementing electroplating step e''') on the object membrane obtained after step F''') to form nanowires 150 in said other nanopores 130;
H''') implementing step d''') on the object membrane obtained after step G''').

Regarding the nanocapacitor 200 able to be obtained with either of the «double irradiation» or «masking» processes, it is a nanocapacitor 200 comprising:
- a membrane 210, formed of an electrically insulating material, having two main outer surfaces 211, 212 separated by a membrane thickness;
- a first layer 214 formed of an electrically conductive material coating one 211 of the two main outer surfaces of the membrane;
- a second layer 216 formed of an electrically conductive material coating the other 212 of the two main outer surfaces of the membrane;
said membrane, in the thickness thereof, being nanostructured first by a first array of electrically semi-conductive or conductive nanowires 15 e.g., metallic connected to the first electrically conductive layer but not to the second electrically conductive layer, and secondly by a second array of electrically semi-conductive or conductive nanowires 150 e.g. metallic connected to the second electrically conductive layer but not to the first electrically conductive layer, said nanowires of the first array of nanowires and of the second array of nanowires being interdigitated.

The electrically insulating membrane 210 of the nanocapacitor can be formed of a material selected from among: polycarbonate (PC), alumina ($Al_2O_3$), polyethylene terephthalate (PET) or polyimide (PI), advantageously Kapton®.

The nanowires of either of the first and second array of nanowires can particularly be metal nanowires selected from among: Au, Zn, Cu, Co, Ni, Ag, Pt, or a metal alloy in particular formed from the aforementioned metals.

The invention claimed is:

1. Process for fabricating a piezoelectric nanogenerator (110, 110', 110'', 110''', 110''''), wherein it comprises the following steps:
  a) providing a membrane (100) in polarised β-PVDF or polarised PVDF-ETrF copolymer therefore having piezoelectric properties, said membrane (100) also having two main outer surfaces (11, 12) separated by a membrane thickness (e);

b) irradiating said membrane (100) via at least one of its two main outer surfaces (11, 12) through the entire thickness of said membrane, with heavy ions having fluence of between $10^3$ ions/cm$^2$ and $10^{10}$ ions/cm$^2$, after which a membrane (101) is obtained having latent tracks (TL) left by passing of the heavy ions through the entire thickness thereof;

c) performing chemical development of the latent tracks (TL) over a predetermined time to maintain a damage zone (ZD) belonging to the latent track, after which a nanostructured membrane (102, 102', 102") is obtained with nanopores (13, 13', 13") comprising a damage zone (ZD) around each nanopore (13, 13', 13");

d) depositing a layer of electrically conductive material on one (12) of the two main outer surfaces (11, 12) of said membrane (102, 102', 102");

e) electroplating an electrically semi-conductive or conductive material in the nanopores (13, 13', 13"), stopping electroplating before complete filling of the nanopores (13, 13', 13"), after which a nanostructured membrane (103, 103', 103") is obtained with nanowires (15, 15', 15") partly filling the nanopores (13, 13', 13"); and f) depositing a layer of electrically conductive material on the other (11) of the two main outer surfaces (11, 12), which is therefore not in contact with the nanowires.

2. The process according to claim 1, wherein for irradiation at step b) of said membrane through the entire thickness thereof, the energy of the heavy ions is between 2 MeV/mau and 15 MeV/mau.

3. The process according to one of the preceding claims, wherein the irradiation step b) is performed with heavy ions of Kr or Xe.

4. The process according to one of the preceding claims, wherein irradiation step b) is performed with heavy ions having fluence of between $10^3$ ions/cm$^2$ and $10^9$ ions/cm.

5. The process according to one of the preceding claims, wherein irradiation step b) is performed in an inert atmosphere.

6. The process according to one of the preceding claims, wherein the chemical development step c) is performed by base hydrolysis with an aqueous solution of 10 N KOH and 0.25 N KMnO$_4$, at a temperature of between 40° C. and 75° C.

7. The process according to one of the preceding claims, comprising the following steps:

A) implementing steps a) to e), where step b) is performed with fluence of between $10^3$ ions/cm$^2$ and $5\times10^9$ ions/cm$^2$, and the electroplating step e) forming nanowires (15) being performed with a first electrically semi-conductive or conductive material;

B) repeating steps b) and c), to allow the forming of other nanopores (130), step b) being performed with fluence of between $10^3$ ions/cm$^2$ and $5\times10^9$ ions/cm;

C) removing layer (14) in electrically conductive material deposited at step d);

D) implementing step f), so that a layer (16) in electrically conductive material is obtained that is not in contact with the nanowires (15, 15', 15"), on one main outer side of said membrane;

E) repeating electroplating step e) to form other nanowires (150) in said other nanopores (130) with a second electrically semi-conductive or conductive material differing from the first electrically semi-conductive or conductive material;

F) repeating step d).

8. The process according to claim 1, comprising the following steps:

A') implementing steps a) to d), step a) being performed with a first membrane called source membrane (MSO);

B') implementing steps a) to c), step a) being performed with another membrane called object membrane (MOB);

C') arranging the object membrane obtained after step B') on the source membrane obtained after step A');

D') implementing step e), this electroplating step allowing the partial filling of each of the nanopores (13) formed by the association of at least one nanopore of the object membrane obtained after step B'), said nanopore being superimposed over at least one nanopore of the source membrane obtained after step A') to form nanowires (15) formed of a first electrically semi-conductive or conductive material, the other nanopores (130) not being filled;

E') separating the two membranes from one another;

F') implementing step f) on the object membrane obtained after step E') so that an electrically conductive layer is defined that is not in contact with the nanowires (15), on a main outer surface of said membrane;

G') implementing electroplating step e) on the object membrane obtained after step F') to form nanowires (150) in said other nanopores (130) with a second electrically semi-conductive or conductive material differing from the first electrically semi-conductive or conductive material;

H') implementing step d) on the object membrane obtained after step G').

9. The process according to claim 7, wherein:
the first material forming nanowires (15) is a semiconductor material having photovoltaic properties;
the second material forming the other nanowires (150) is a semiconductor material having thermoelectric properties.

* * * * *